United States Patent
Watanabe et al.

(10) Patent No.: US 8,217,517 B2
(45) Date of Patent: Jul. 10, 2012

(54) SEMICONDUCTOR DEVICE PROVIDED WITH WIRE THAT ELECTRICALLY CONNECTS PRINTED WIRING BOARD AND SEMICONDUCTOR CHIP EACH OTHER

(75) Inventors: Mitsuhisa Watanabe, Tokyo (JP); Keiyo Kusanagi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 101 days.

(21) Appl. No.: 12/830,846

(22) Filed: Jul. 6, 2010

(65) Prior Publication Data
US 2011/0006418 A1    Jan. 13, 2011

(30) Foreign Application Priority Data
Jul. 9, 2009    (JP) ................................. 2009-162860

(51) Int. Cl.
*H01L 23/48* (2006.01)
*H01L 23/52* (2006.01)

(52) U.S. Cl. ........ 257/737; 257/776; 257/784; 257/788; 257/E23.023; 257/E23.024

(58) Field of Classification Search .................. 257/737, 257/776, 784, 788, E23.023, E23.024
See application file for complete search history.

(56) References Cited

U.S. PATENT DOCUMENTS

| 6,348,363 B1 | 2/2002 | Chung et al. |
| 2003/0038355 A1* | 2/2003 | Derderian ..................... 257/686 |
| 2007/0200258 A1* | 8/2007 | Mahler et al. ................. 257/787 |

FOREIGN PATENT DOCUMENTS

| JP | 11-135539 A | 5/1999 |
| JP | 2001-24024 A | 1/2001 |
| JP | 2008-251929 A | 10/2008 |

* cited by examiner

*Primary Examiner* — Tu-Tu Ho
(74) *Attorney, Agent, or Firm* — Foley & Lardner LLP

(57) ABSTRACT

In one embodiment, a semiconductor device includes a printed wiring board provided with a connection pad, a semiconductor chip provided with an electrode pad and a conductive wire. One end of the conductive wire is connected to the connection pad of the printed wiring board and the other end of the conductive wire is connected to the electrode pad of the semiconductor chip. The semiconductor chip is mounted on the printed wiring board so that the first surface of the semiconductor chip provided with the electrode pad is oriented opposite to the printed wiring board. A first insulating layer is formed on the first surface of the semiconductor chip oriented opposite to the printed wiring board. A thermoplastic second insulating layer is formed on the first insulating layer. Part of the conductive wire between one end and the other end is buried in the second insulating layer.

18 Claims, 7 Drawing Sheets

SEMICONDUCTOR DEVICE PROVIDED WITH WIRE THAT ELECTRICALLY CONNECTS PRINTED WIRING BOARD AND SEMICONDUCTOR CHIP EACH OTHER

This application is based upon and claims the benefit of priority from Japanese patent application No. 2009-162860, filed on Jul. 9, 2009, the disclosure of which is incorporated herein in its entirety by reference.

BACKGROUND OF THE INVENTION

1. Field of the Invention

The present invention relates to a semiconductor device provided with a wire that electrically connects a printed wiring board and a semiconductor chip, and a method for manufacturing the semiconductor device.

2. Description of Related Art

Various types of semiconductor devices are currently being manufactured. A semiconductor device includes a semiconductor chip and a printed wiring board. The semiconductor chip is mounted on a printed wiring board. The semiconductor chip is electrically connected to pad formed on the printed wiring board.

As one such semiconductor device, there is a device in which a semiconductor chip and a printed wiring board are electrically connected via wires. The wires are connected to electrode pads on the semiconductor chip and connection pads on the printed wiring board. JP2001-024024A, JP2008-251929A and JP11-135539A disclose semiconductor devices in which electrode pads in the center of one surface of the semiconductor chip are provided.

When the electrode pads are formed in the center of the semiconductor chip, the wires extend from the center of the semiconductor chip, passing through the vicinity of the edge of the semiconductor chip to the connection pads of the printed wiring board. When the conductive wires are long in this way, the loop of the conductive wires becomes high. As a result, there is a problem that it is difficult to make the semiconductor device thinner. There is also a problem in which the flow of sealing resin that seals the semiconductor chip causes a wire sweep, and a short circuit is likely to occur in the wire.

In order to solve these problems, the semiconductor device described in JP11-135539A includes a lower polyimide tape pasted to the semiconductor chip and a wire that contacts the lower polyimide tape. An upper polyimide tape is pasted to the lower polyimide tape. The wire is sandwiched between both polyimide tapes and is fixed by both polyimide tapes.

According to JP11-135539A, after the printed wiring board and the semiconductor chip are connected via the wire, the wire is strongly pressed by the upper polyimide tape. For this reason, the wire may be deformed. When the wire is deformed, there is a possibility that a short circuit may occur between wires or between the wire and the semiconductor chip.

Furthermore, there is also another problem in which a cavity may be formed between the two polyimide tapes. In this case, the fixing of the wire may become insufficient. Furthermore, since the two polyimide tapes to which an adhesive is applied are superimposed one upon the other, there is another problem in which the total thickness of the two polyimide tapes increases and the thickness of the semiconductor device increases.

Therefore, it is desired that an improved semiconductor device and a method for manufacturing such a semiconductor device be provided.

SUMMARY

According to a method for manufacturing a semiconductor device in one embodiment, a printed wiring board mounted with a semiconductor chip is prepared. The printed wiring board is provided with a connection pad. A first surface of the semiconductor chip provided with the electrode pad is oriented opposite to the printed wiring board. A first insulating layer is formed on the first surface of the semiconductor chip oriented opposite to the printed wiring board. A thermoplastic second insulating layer is formed on the first insulating layer. One end of a conductive wire is thermo-compression bonded to the connection pad of the printed wiring board and the other end of the conductive wire is thermo-compression bonded to the electrode pad of the semiconductor chip, so that part of the conductive wire between the one end and the other end is buried in the second insulating layer softened by heat generated during thermo-compression bonding.

In one embodiment, a semiconductor device includes a printed wiring board provided with a connection pad, a semiconductor chip provided with an electrode pad and a conductive wire. One end of the conductive wire is connected to the connection pad of the printed wiring board and the other end of the conductive wire is connected to the electrode pad of the semiconductor chip. The semiconductor chip is mounted on the printed wiring board so that the first surface of the semiconductor chip provided with the electrode pad is oriented opposite to the printed wiring board.

A first insulating layer is formed on the first surface of the semiconductor chip oriented opposite to the printed wiring board. A thermoplastic second insulating layer is formed on the first insulating layer. Part of the conductive wire between one end and the other end is buried in the second insulating layer.

The present invention prevents a short circuit between conductive wires and/or a short circuit between the conductive wire and the semiconductor chip.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
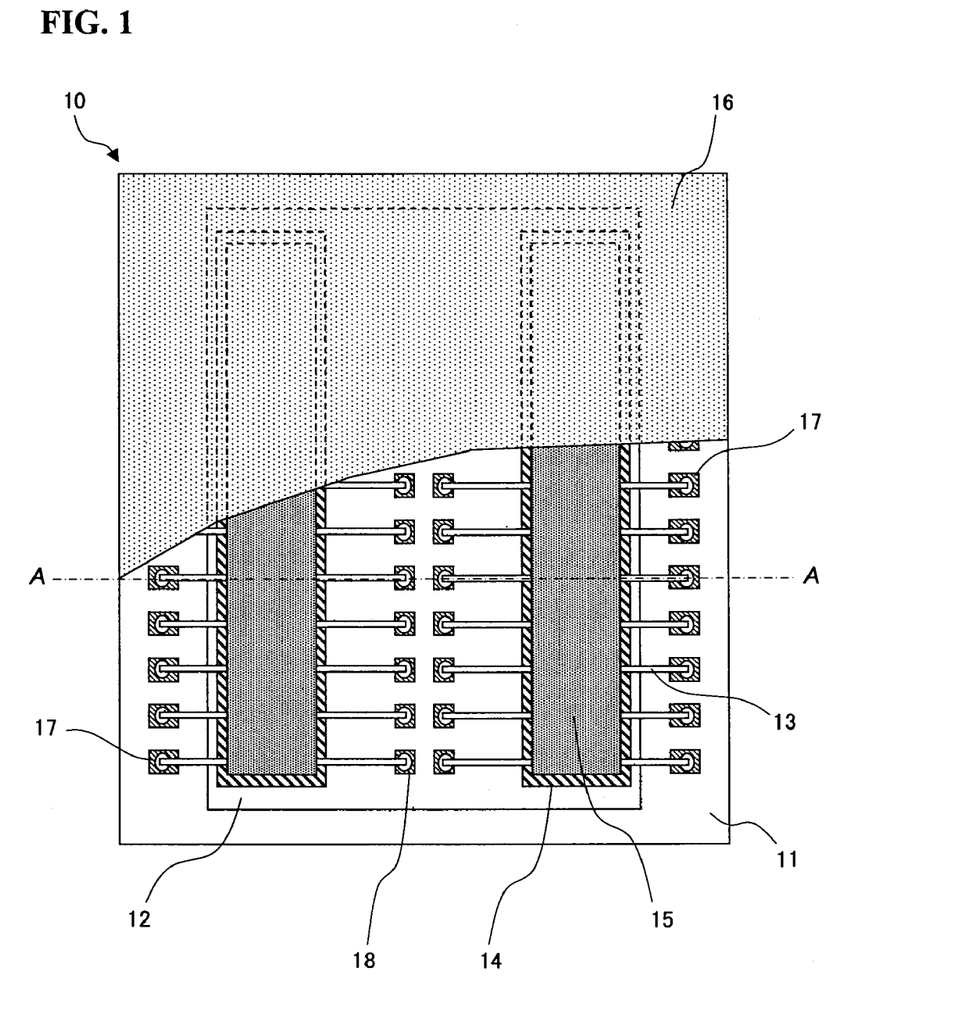
FIG. 1 is a schematic plan view of a semiconductor device according to a first exemplary embodiment.
Figure 2:
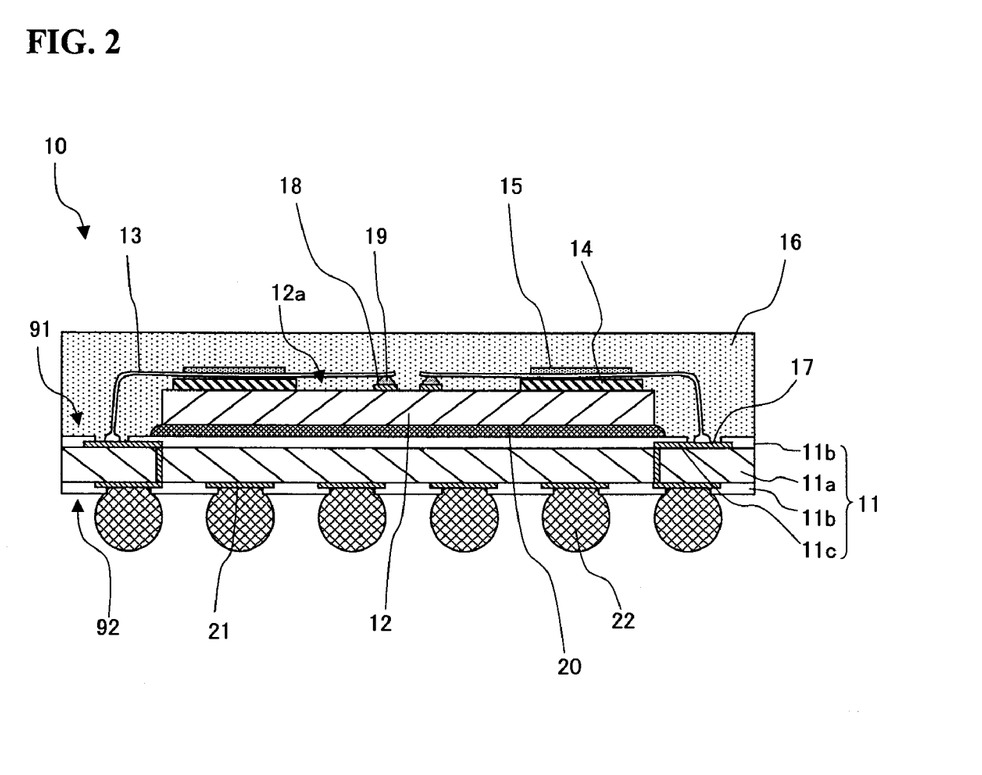
FIG. 2 is a schematic cross-sectional view of the semiconductor device along line A-A in FIG. 1.

FIG. 1 is a schematic plan view of a semiconductor device according to a first exemplary embodiment. In FIG. 1, part of sealing resin is not shown to clearly demonstrate the configuration of the semiconductor device. FIG. 2 is a schematic cross-sectional view of the semiconductor device along line A-A in FIG. 1.

In the first exemplary embodiment, a ball grid array (BGA) type semiconductor device will be described in detail. However, the present invention is not limited to the BGA type semiconductor device, but is applicable to various types of semiconductor devices.

Semiconductor device 10 includes printed wiring board 11 on which a wiring pattern is formed, semiconductor chip 12 and conductive wire 13. Conductive wire 13 electrically connects semiconductor chip 12 and printed wiring board 11.

Printed wiring board 11 has, for example, a substantially rectangular tabular shape. Printed wiring board 11 includes insulating base 11a, wiring pattern 11c formed on base 11a and insulating protective films 11b provided on both sides of base 11a to protect wiring pattern 11c. Insulating base 11a is made of, for example, a glass epoxy substrate. Wiring pattern 11c is made of, for example, copper (Cu).

Protective film 11b is made of, for example, a solder resist. Protective film 11c has an opening and part of wiring pattern 11c is exposed from this opening. Connection pads 17 are disposed in part of first surface 91 of the printed wiring board from which the wiring pattern is exposed. Lands 21 are provided on second surface 92 opposite to first surface 91 of the printed wiring board. Land 21 is electrically connected to wiring pattern 11c of printed wiring board 11.

In the present exemplary embodiment, a plurality of lands 21 are arranged in a lattice pattern on second surface 92 of the printed wiring board. Connection pads 17 disposed on first surface 91 of the printed wiring board are electrically connected to lands 21 corresponding thereto and disposed on second surface 92 of the printed wiring board via wiring pattern 11c.

Conductive balls 22 are disposed on lands 21 provided on second surface 92 of the printed wiring board. For example, a solder ball is used as conductive ball 22. Conductive balls 22 are used as a joint to mount semiconductor device 10 on a motherboard.

Semiconductor chip 12 is mounted on first surface 91 of the printed wiring board via joint 20. For example, an insulating adhesive or die attached film (DAF) is used as joint 20.

A predetermined circuit is formed on first surface 12a of semiconductor chip 12 oriented opposite to printed wiring board 11. When semiconductor chip 12 is, for example, a dynamic random access memory (DRAM), the circuit is a memory circuit.

A plurality of electrode pads 18 may be disposed in two rows in the center of first surface 12a of the semiconductor chip. Metal bumps 19 are made of, for example, gold (Au). Metal bumps 19 are formed on electrode pads 18 of semiconductor chip 12. If electrode pads 18 and conductive wires 13 can be directly thermo-compression bonded, metal bumps 19 need not be provided.

One end of conductive wire 13 is connected to connection pad 17 of printed wiring board 11. The other end of conductive wire 13 is connected to metal bump 19 on electrode pad 18. Conductive wires 13 are made of, for example, gold.

First insulating layer 14 is formed on first surface 12a of the semiconductor chip. Thermoplastic second insulating layer 15 is formed on first insulating layer 14. First insulating layer 14 is not softened when the conductive wire is thermo-compression bonded is used. Therefore, as an example, first insulating layer 14 is made of thermosetting resin. One example of such thermosetting resin is epoxy resin whose setting temperature is about 140 degrees.

It is preferred that second insulating layer 15 has a thermoplastic. Second insulating layer 15 softens when conductive wire 13 is thermo-compression bonded. An example of second insulating layer 15 is epoxy resin whose softening temperature is on the order of 150° C.

In the specification and claims, the term "softening" also includes melting and liquefying.

First insulating layer 14 and second insulating layer 15 may be disposed on a peripheral part. Conductive wire 13 that extends from connection pad 17 of printed wiring board 11 passes over semiconductor chip 12 and reaches metal bump 19 on semiconductor chip 12. Part of conductive wire 13 is buried in second insulating layer 15. The part of conductive wire 13 may or may not contact first insulating layer 14.

First insulating layer 14 and second insulating layer 15 may also be formed along a column direction of electrode pad 18 in a peripheral part of semiconductor chip 12. Sealed body 16 may also be formed in semiconductor device 10. Sealed body 16 covers at least semiconductor chip 12 and conductive wires 13. Insulating thermosetting resin such as epoxy resin is used for sealed body 16.

Since conductive wire 13 is buried in second insulating layer 15, conductive wire 13 is barely deformed even if an external force is applied thereto. When sealed body 16 is formed in semiconductor device 10, this prevents wire sweep of conductive wire 13 caused by the flow of sealed body 16. This prevents any short circuit from occurring between conductive wires 13.

Furthermore, since first insulating layer 14 is interposed between semiconductor chip 12 and second insulating layer 15, any short circuit between conductive wire 13 and semiconductor chip 12 is prevented.

Next, the method for manufacturing above semiconductor device 10 will be described. FIG. 3A to FIG. 3F are process charts illustrating the method for manufacturing a semiconductor device. FIG. 3A to FIG. 3F show cross sections of the semiconductor device.

Figure 3A:
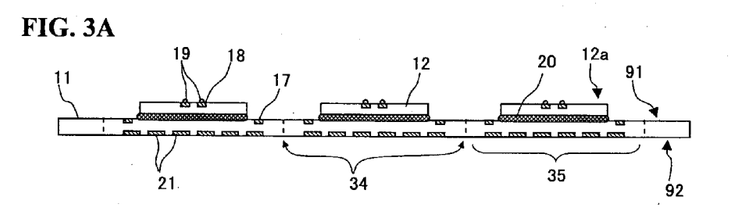
FIG. 3A to FIG. 3F are step diagrams illustrating manufacturing steps of the semiconductor device shown in FIG. 1.

First, printed wiring board 11 mounted with semiconductor chip 12 is prepared (see FIG. 3A). Printed wiring board 11 is preferably a multi-cavity glass epoxy printed wiring board. As described above, printed wiring board 11 includes an insulating base, a wiring pattern formed on this base and insulating protective films provided on both sides of the base to protect the wiring pattern. The insulating base is made of, for example, a glass epoxy substrate. The wiring pattern is made of, for example, copper (Cu) and the insulating protective film is made of, for example, a solder resist.

The protective film includes an opening, and part of the wiring pattern is exposed from the opening. Connection pad 17 is disposed in the part of first surface 91 of the printed wiring board where the wiring pattern is exposed. Land 21 is provided on second surface 92 opposite to first surface 91 of the printed wiring board. Land 21 is electrically connected to connection pad 17 via the wiring pattern.

Dicing lines 34 are formed on printed wiring board (wafer) 11 having a plurality of product areas 35. Dicing lines 34 indicate positions to be cut between product areas 35. Semiconductor chip 12 is mounted on each product area 35 of printed wiring board 11 via joint 20.

Electrode pads 18 are formed on first surface 12a of the semiconductor chip oriented opposite to printed wiring board 11. Electrode pads 18 may also be provided in the center of first surface 12a of the semiconductor chip 12. Semiconductor chip 12 is mounted on printed wiring board 11 using, for example, a die bonding device (not shown).

Conductive metal bumps 19 are formed on electrode pads 18 of semiconductor chip 12. An end of the conductive wire is melted by high-voltage discharge, a ball is formed at the end of the conductive wire and the ball is then subjected to ultrasonic and thermo-compression bonding to the electrode pad. The rear end of the conductive wire is then cut and metal bump 19 is thereby formed on electrode pad 18. Metal bump 19 is formed using, for example, a wire bonding device.

Figure 3B:
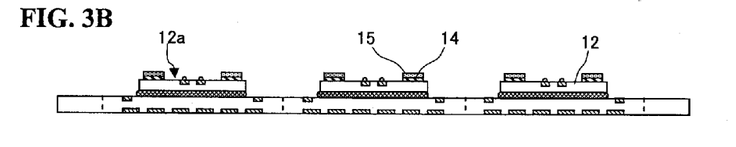

Next, first insulating layer 14 is formed on first surface 12a of the semiconductor chip 12 and thermoplastic second insulating layer 15 is formed on first insulating layer 14 (see FIG. 3B). First insulating layer 14 and second insulating layer 15 are preferably formed in the peripheral part of first surface 12a of the semiconductor chip.

It is preferred that second insulating layer 15 is softened by heat generated during wire bonding. Epoxy resin, for example, whose softening temperature is on the order of 150° C. can be used for second insulating layer 15.

Figure 3C:
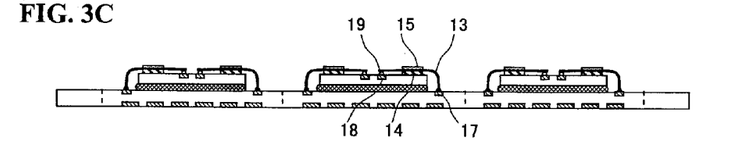

Next, a wire bonding step will be carried out in which printed wiring board 11 and semiconductor chip 12 are electrically connected using conductive wire 13 (see FIG. 3C). In the wire bonding step, one end 13a of the conductive wire 13 is thermo-compression bonded to connection pad 17 of the printed wiring board and other end 13b of the conductive wire 13 is thermo-compression bonded to electrode pad 18 of the semiconductor chip, so that part of the conductive wire 13 between one end 13a and other end 13b is buried in second insulating layer 15 softened by heat generated during thermo-compression bonding.

As conductive wire 13, for example, a gold wire is used. Conductive wire 13 can be connected not only through bonding using only thermal energy but also through ultrasonic and thermo-compression bonding using ultrasound energy as well.

Figure 4A:
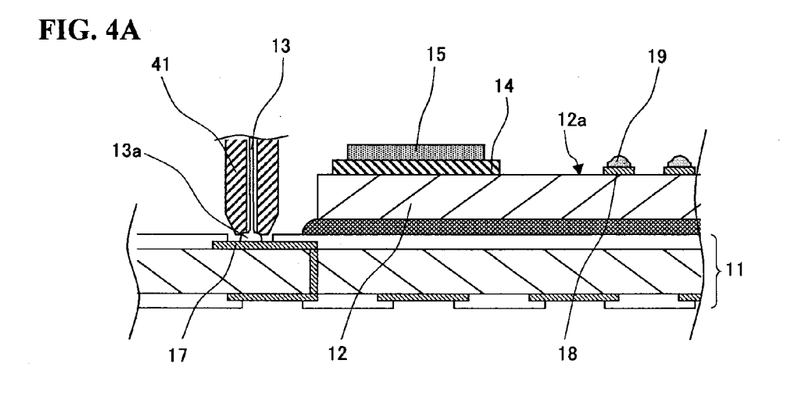
FIG. 4A to FIG. 4C are schematic diagrams illustrating details of an example of wire bonding.

An example of wire bonding will be described in detail with reference to FIGS. 4A to 4C. The wire bonding step is performed using a bonding device having, for example, a bonding tool called "capillary 41".

First, one end 13a of the conductive wire led out from an end of capillary 41 is melted and one end 13a of the conductive wire is formed into a ball shape. Next, as shown in FIG. 4A, one end 13a of the conductive wire 13 is thermo-compression bonded to connection pad 17 of printed wiring board 11.

Figure 4B:
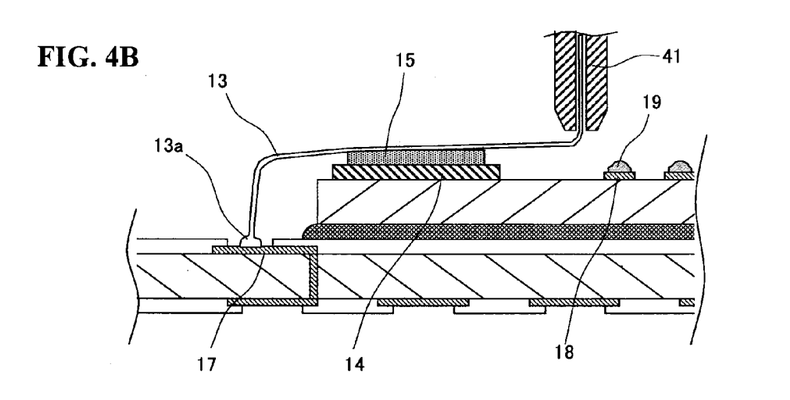
Figure 4C:
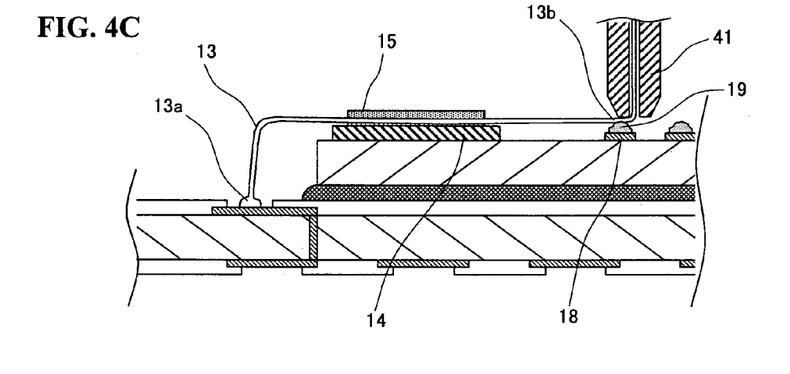

Next, as shown in FIG. 4B, capillary 41 is moved along a predetermined path. To be more specific, capillary 41 is moved from connection pad 17 of printed wiring board 11 toward electrode pad 18 of the semiconductor chip thorough second insulating layer 15 on semiconductor chip 12. Other end 13b of the conductive wire is then thermo-compression bonded to metal bump 19 on electrode pad 18.

If possible, other end 13b of the conductive wire may also be directly thermo-compression bonded to electrode pad 18.

When conductive wire 13 is thermo-compression bonded to pads 17 and 18, at least one of conductive wire 13 and pads 17, 18 is preferably heated in order to improve the thermo-compression efficiency. The temperature of capillary 41 may be increased to heat conductive wire 13.

Conductive wire 13 is preferably heated to a softening temperature or above of second insulating layer 15 so that second insulating layer 15 is softened when conductive wire 13 contacts second insulating layer 15.

Furthermore, printed wiring board 11 may be heated in order to heat connection pad 17 and electrode pad 18. Printed wiring board 11 is heated, for example, by increasing the temperature of a stage that holds printed wiring board 11. Printed wiring board 11 is preferably heated to a softening temperature or above of second insulating layer 15 so that second insulating layer 15 is softened.

In the present exemplary embodiment, second insulating layer 15 is heated during wire bonding and second insulating layer 15 is softened. Conductive wire 13 is then buried in softened second insulating layer 15.

Since second insulating layer 15 is softened during thermo-compression bonding, part of conductive wire 13 is easily buried in second insulating layer 15 without conductive wire 13 being deformed. This prevents a short circuit between conductive wires.

Second insulating layer 15 is preferably higher than metal bump 19 on electrode pad 18. Thus, when other end 13b of the conductive wire is thermo-compression bonded to metal bump 19, part of the conductive wire between one end 13a and other end 13b contacts second insulating layer 15 and is buried in second insulating layer 15.

After wire bonding ends, second insulating layer 15 is cooled and hardened. Thus, conductive wire 13 is stably fixed by second insulating layer 15. Therefore, even if an external force is applied to conductive wire 13, deformation of the conductive wire is prevented.

It is preferred that first insulating layer 14 is not soften during thermo-compression bonding. This is intended to prevent conductive wire 13 buried in second insulating layer 15 from contacting semiconductor chip 12. This prevents a short circuit between the conductive wire and the semiconductor chip.

In order to prevent contact between conductive wire 13 and semiconductor chip 12, first insulating layer 14 is preferably formed in the peripheral part of first surface 91 of the semiconductor chip. Thus, even if conductive wire 13 is stretched between connection pad 17 and electrode pad 18, the possibility that conductive wire 13 may contact the edge of semiconductor chip 12 is reduced. In this case, in the wire bonding step, part of conductive wire 13 contacts second insulating layer 15 on first insulating layer 14 and part of conductive wire 13 is buried in second insulating layer 15.

In the above described exemplary embodiment, the conductive wire extends from connection pad 17 of the printed wiring board toward second insulating layer 15, passes through the second insulating layer and extends toward electrode pad 18 of the semiconductor chip. Without being limited to this embodiment, however, the conductive wire may also extend from electrode pad 18 of the semiconductor chip toward second insulating layer 15, pass through the second insulating layer and extend toward connection pad 17 of the printed wiring board.

First insulating layer 14 may also be thermosetting resin that is hardened by heat generated when the conductive wire is thermo-compression bonded. In this case, the setting temperature of first insulating layer 14 is preferably lower than the softening temperature of second insulating layer 15. In this way, since first insulating layer 14 is hardened before second insulating layer 15 is softened, the possibility that first insulating layer 14 and second insulating layer 15 may be mixed together is reduced. Epoxy resin, for example, whose setting temperature is 140° C. or below can be used for first insulating layer 14.

Since part of conductive wire 13 is buried in second insulating layer 15, wire bonding is possible with a low loop even in the case of a conductive wire having a small diameter, for example, a diameter on the order of 15 μm. Furthermore, even when there is an electrode pad in the center of the semiconductor chip and conductive wire 13 becomes longer, wire bonding is possible with a low loop. Therefore, it is possible to shorten conductive wire 13 and realize a cost reduction.

Different adhesives need not be applied to first insulating layer 14 and second insulating layer 15. Therefore, the total film thickness of first insulating layer 14 and second insulating layer 15 can be made smaller than the total thickness of two polyimide tapes to which the adhesive is applied. The film thickness of first insulating layer 14 and second insulating layer 15 can be set, for example, on the order of 50 µm. Furthermore, second insulating layer 15 is softened once and then hardened, and therefore it is possible to prevent cavities from being generated between first insulating layer 14 and second insulating layer 15.

Although a connection of the conductive wire using ball bonding has been described in the present exemplary embodiment, the conductive wire may also be connected using wedge bonding.

Figure 3D:
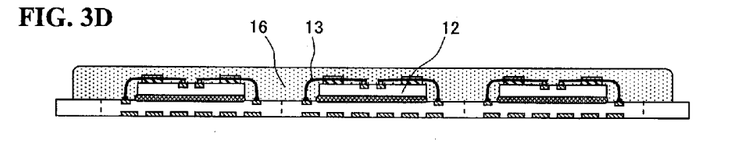

Next, sealed body 16 is formed in wafer-shaped printed wiring board 11 (see FIG. 3D). In the present exemplary embodiment, thermosetting epoxy resin is used as an example of the sealed body. Sealed body 16 covers at least semiconductor chip 12 and conductive wire 13.

In the present exemplary embodiment, sealed body 16 is formed on printed wiring board 11 at one time. Sealed body 16 is formed using, for example, a transfer molding device (not shown). The transfer molding device includes a molding die made up of upper and lower dies. A cavity made according to the shape of sealed body 16 is formed inside the molding die. Printed wiring board 11 is clamped using this molding die and sealed body 16 is made to flow into the cavity. After filling the cavity with sealed body 16, sealed body 16 is thermoset.

When the sealed body is made to flow into the cavity of the molding die, an external force is applied to conductive wire 13 by the flow of sealed body 16. In the present exemplary embodiment, since part of conductive wire 13 is buried in second insulating layer 15, the flow of conductive wire 13 is suppressed. Therefore, it is possible to prevent a short circuit from being generated between conductive wires, and as a result, the manufacturing yield of the semiconductor device improves.

Furthermore, since conductive wire 13 is low-looped, the thickness of sealed body 16 can be reduced and the thickness of the semiconductor device can thereby be reduced.

Figure 3E:
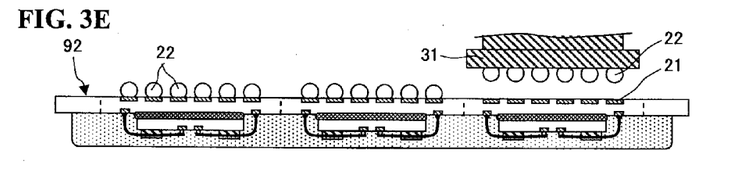

Next, conductive ball 22 is mounted on land 21 provided on second surface 92 of the printed wiring board (see FIG. 3E). As conductive ball 22, for example, a solder ball is used. The conductive ball is mounted using, for example, mounting tool 31.

Mounting tool 31 has a plurality of suction holes and can hold solder balls in the suction holes by means of suction. The suction holes of mounting tool 31 are formed in accordance with the positions of lands 21 of printed wiring board 11.

Mounting tool 31 places conductive balls 22 held in the suction holes entirely on lands 21 at one time. After mounting conductive balls 22, printed wiring board 11 is subjected to reflow at a predetermined temperature and the conductive balls 22 are thereby mounted on land 21.

Figure 3F:
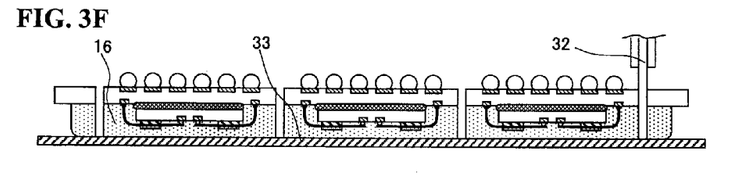

Next, printed wiring board 11 is cut along dicing lines 34 and separated into individual semiconductor devices (see FIG. 3F). This operation can be performed using a dicing device (not shown).

Sealed body 16 on printed wiring board 11 is adhered to dicing tape 33 and printed wiring board 11 is supported by dicing tape 33. In this condition, printed wiring board 11 is cut using dicing blade 32 and printed wiring board 11 is separated into individual pieces. Next, the individual semiconductor devices are picked up from dicing tape 33.

The present exemplary embodiment describes a method for manufacturing according to an MAP (Mold Array Process) scheme whereby sealed body 16 is formed entirely on printed wiring board 11 for multiple semiconductor devices and then divided into the individual semiconductor devices. However, the present invention is not limited to this scheme, but sealed body 16 separated per individual semiconductor device may also be formed.

There can also be a frame in which a positioning hole is formed at the edge of printed wiring board 11. This allows printed wiring board 11 to be transferred and positioned in each manufacturing step.

Figure 5:
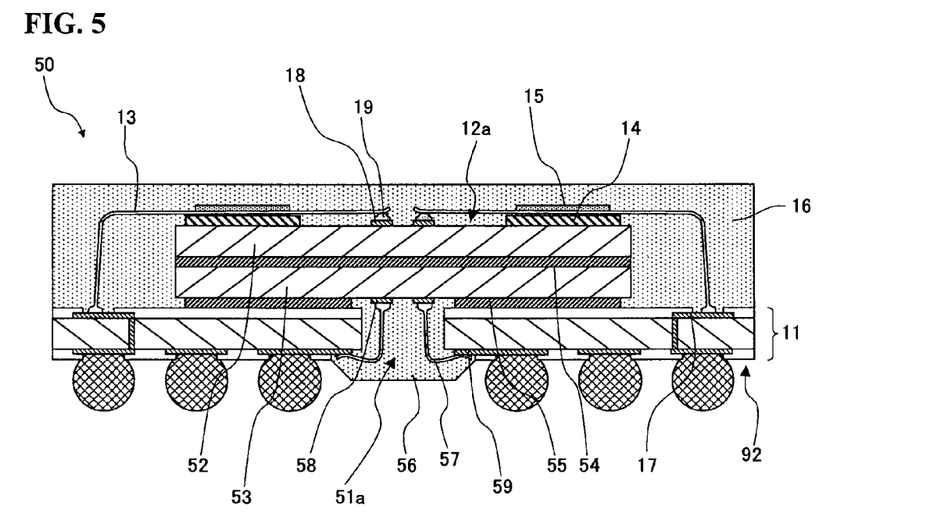
FIG. 5 is a schematic cross-sectional view of a semiconductor device according to a second exemplary embodiment.

FIG. 5 is a schematic cross-sectional view of a semiconductor device according to a second exemplary embodiment. Semiconductor device 50 is an MCP (Multi Chip Package) type semiconductor device mounted with a plurality of semiconductor chips. Hereinafter, a configuration similar to that of the first exemplary embodiment will be omitted.

Semiconductor device 50 includes first semiconductor chip 52, second semiconductor chip 53, printed wiring board 11 and conductive wire 13. In the second exemplary embodiment, opening 51$a$ is formed in the center of printed wiring board 11.

Second semiconductor chip 53 is mounted on printed wiring board 11 via joint 55. First semiconductor chip 52 is mounted on printed wiring board 11 via second semiconductor chip 53. To be more specific, joint 54 is interposed between first semiconductor chip 52 and second semiconductor chip 53. First semiconductor chip 52 has a configuration similar to that of the semiconductor chip shown in the first exemplary embodiment.

Joint 55 has an opening at the same position as that of opening 51$a$ of the printed wiring board. Electrode pad 58 of the second semiconductor chip is located at the opening of printed wiring board 11. Conductive wire 57 that connects electrode pad 58 of the second semiconductor chip and printed wiring board 11 runs from electrode pad 58 of the second semiconductor chip passing through opening 51$a$ and is connected to connection pad 59 formed on second surface 92 of the printed wiring board.

For example, an insulating adhesive or die attached film (DAF) is used as joint 54 and joint 55.

Opening 51$a$ of the printed wiring board is filled with sealed body 56. Sealed body 56 covers at least second semiconductor chip and conductive wire 57.

Electrode pad 18 is provided on first surface 12$a$ of first semiconductor chip 52 oriented opposite to printed wiring board 11. Furthermore, as in the case of the first exemplary embodiment, first insulating layer 14 is formed on first surface 12$a$ of the first semiconductor chip. Thermoplastic second insulating layer 15 is formed on first insulating layer 14.

Part of conductive wire 13 that connects electrode pad 18 of first semiconductor chip 52 and connection pad 17 of printed wiring board 11 is buried in second insulating layer 15.

The semiconductor device of the second exemplary embodiment has an effect similar to that of the first exemplary embodiment with respect to conductive wire 13 that electrically connects first semiconductor chip 52 and printed wiring board 11. Furthermore, since a plurality of semiconductor chips 52 and 53 are mounted on one printed wiring board 11, it is possible for the semiconductor device to achieve a larger capacity and higher functionality.

Figure 6:
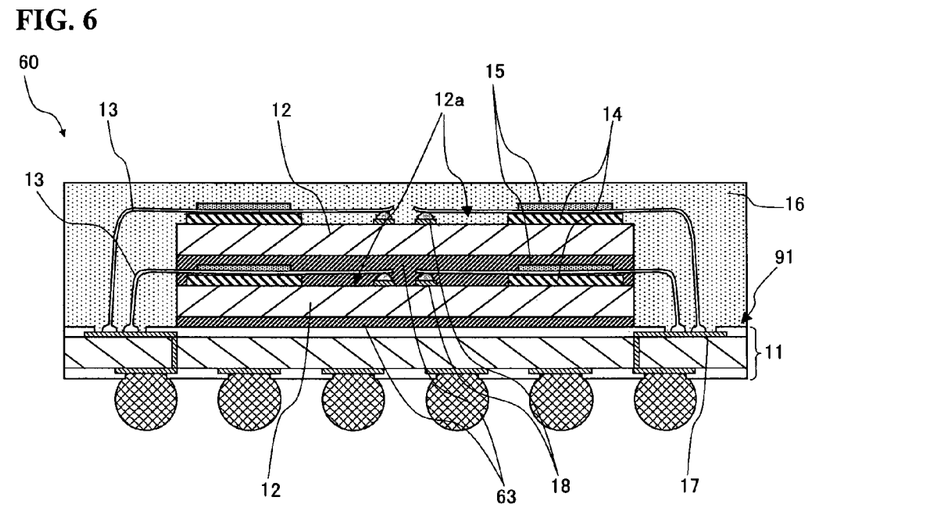
FIG. 6 is a schematic cross-sectional view of a semiconductor device according to a third exemplary embodiment.

FIG. 6 is a schematic cross-sectional view of a semiconductor device according to a third exemplary embodiment. The semiconductor device of the third exemplary embodiment is an MCP-type semiconductor device mounted with a plurality of semiconductor chips. Hereinafter, descriptions of components similar to those of the first exemplary embodiment will be omitted.

Semiconductor device 60 of the third exemplary embodiment has semiconductor chip 12 mounted on first surface 91 of printed wiring board 11 and another semiconductor chip 12 mounted on the former semiconductor chip 12. As semiconductor chip 12, for example, a DRAM chip can be used.

Insulating joint 63 (e.g., DAF) is interposed between two semiconductor chips 12. Furthermore, insulating joint 63 is also provided between the lower semiconductor chip 12 and printed wiring board 11.

First insulating layers 14 are formed on first surfaces 12a of semiconductor chip 12 respectively. Thermoplastic second insulating layers 15 are formed on first insulating layers 14. Connection pad 17 of the printed wiring board and electrode pads 18 of the semiconductor chip are connected via conductive wires 13 respectively. Conductive wires 13 are buried in second insulating layers 15.

As in the case of the semiconductor device of the first exemplary embodiment, the semiconductor device according to the third exemplary embodiment prevents a short circuit between conductive wires and between the conductive wire and the semiconductor chip.

Furthermore, when a plurality of semiconductor chips laminated to each other have similar structures, a wiring pattern formed on printed wiring board 11 is simplified, and it is possible to improve the electric characteristics of the semiconductor device.

A semiconductor device in which two semiconductor chips are laminated has been described in the present exemplary embodiment, but three or more semiconductor chips may also be laminated. When three or more semiconductor chips are laminated, the first surface of the semiconductor chip of the lowest layer, on which the electrode pad is provided, may be oriented toward the printed wiring board side as described in the second exemplary embodiment.

Figure 7:
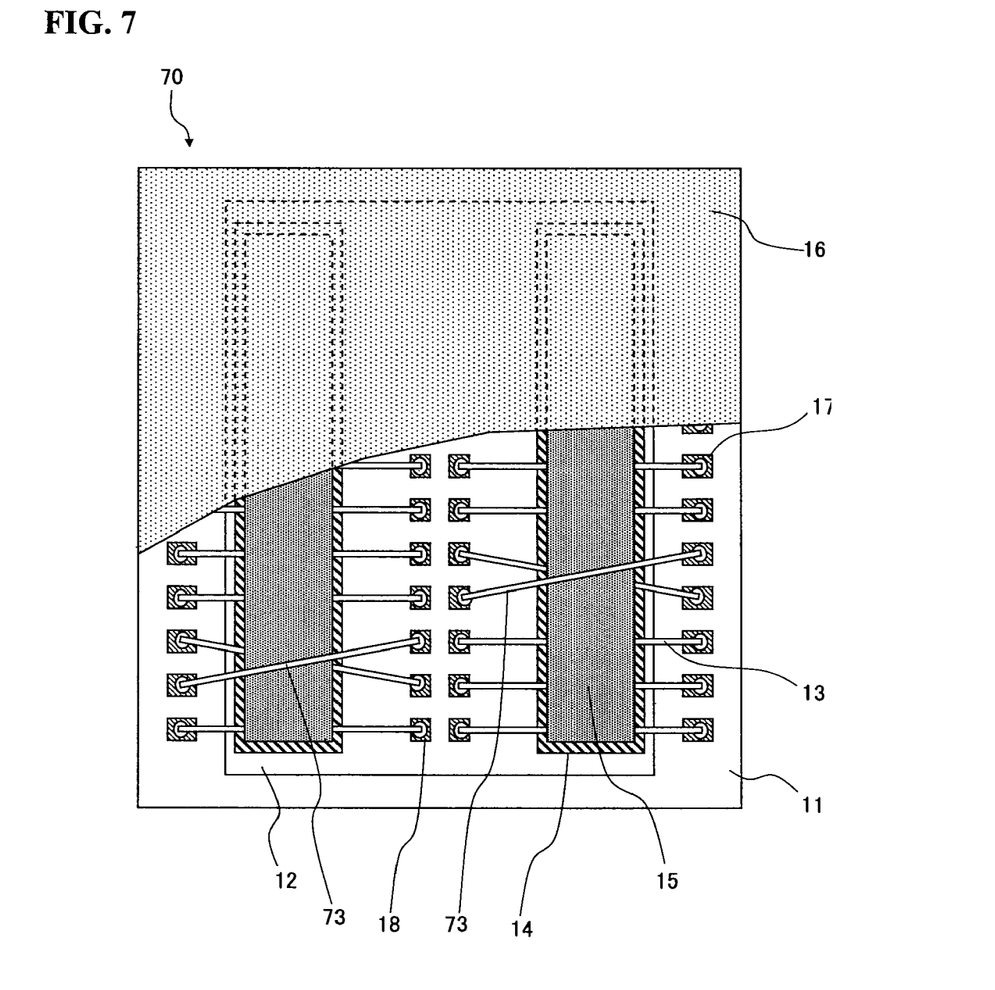
FIG. 7 is a schematic plan view of a semiconductor device according to a fourth exemplary embodiment.

FIG. 7 is a schematic plan view of a semiconductor device according to a fourth exemplary embodiment. In FIG. 7, part of the sealed body is not shown in order to clearly demonstrating the inner configuration of the semiconductor device. Hereinafter, descriptions of components similar to those of the semiconductor device according to the first exemplary embodiment will be omitted.

In semiconductor device 70 of the fourth exemplary embodiment, some conductive wires 73 of a plurality of conductive wires are disposed on second insulating layer 15. This allows one conductive wire 13 of the plurality of conductive wires to cross another conductive wire 73.

Thus, the two conductive wires that cross each other are separated by second insulating layer 15. Thus, a short circuit between conductive wires is prevented. The degree of freedom of wiring for semiconductor device 70 is thereby improved.

Figure 8:
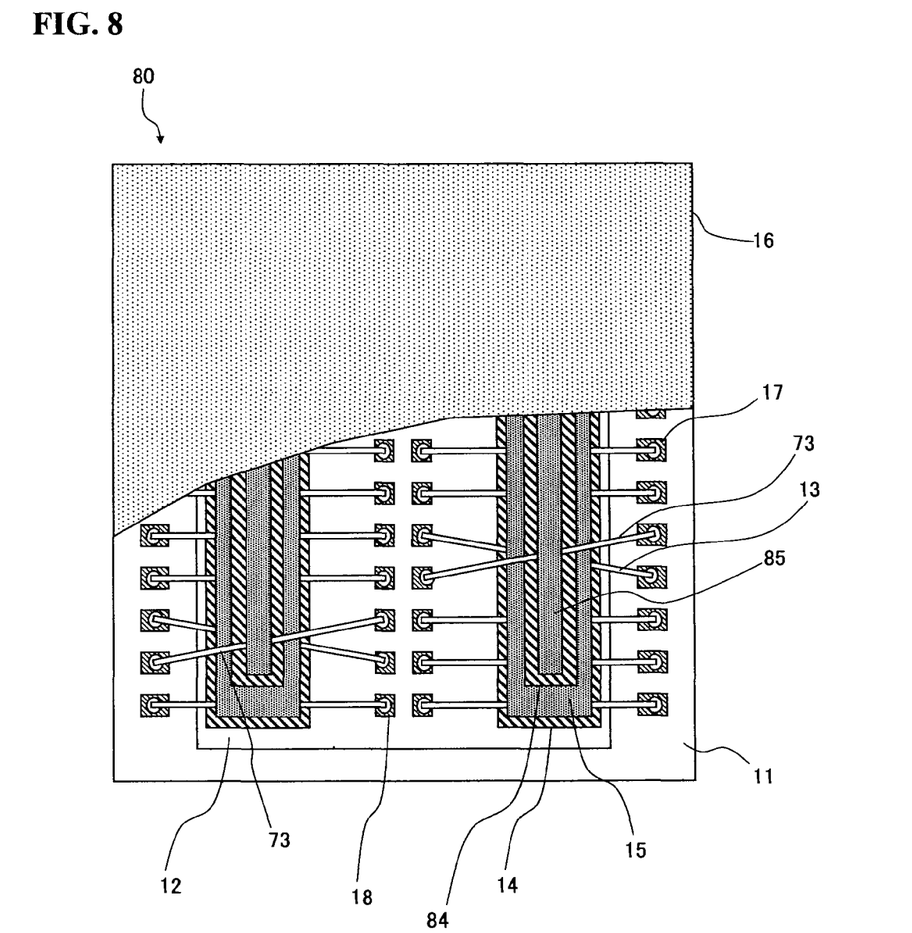
FIG. 8 is a schematic plan view of a semiconductor device according to a fifth exemplary embodiment.

FIG. 8 is a schematic cross-sectional view of a semiconductor device according to a fifth exemplary embodiment. In FIG. 8, part of the sealed body is not illustrated in order to clearly demonstrate the inner configuration of the semiconductor device. Hereinafter, descriptions of components similar to those of the semiconductor device of the first exemplary embodiment will be omitted.

First insulating layer 14 is formed on semiconductor chip 12 of semiconductor device 80. Second insulating layer 15 is formed on first insulating layer 14. In semiconductor device 80 of the fifth exemplary embodiment, third insulating layer 84 is further formed on second insulating layer 15 and fourth insulating layer 85 is formed on third insulating layer 84.

Here, third insulating layer 84 is preferably made of similar to that of first insulating layer 14, and fourth insulating layer 85 is preferably made of similar to that of second insulating layer 15. That is, fourth insulating layer 85 is a thermoplastic insulating layer.

Several conductive wires 13 are buried in second insulating layer 15. Furthermore, other conductive wires 73 are buried in fourth insulating layer 85. In this way, two conductive wires 13, 73 can cross each other. In the semiconductor device of the fifth exemplary embodiment, two conductive wires 13, 73 that cross each other are separated by third insulating layer 84.

The semiconductor device of the fifth exemplary embodiment will be manufactured as follows. First, as described above, semiconductor chip 12 is mounted on printed wiring board 11 and first insulating layer 14 is formed on semiconductor chip 12 and then second insulating layer 15 is formed on first insulating layer 14.

Hereinafter, lower conductive wire 13 is thermo-compression bonded to connection pad 17 of printed wiring board 11 and electrode pad 18 of semiconductor chip 12, and part of lower conductive wire 13 is buried in second insulating layer 15.

Next, third insulating layer 84 is formed on second insulating layer 15 and thermoplastic fourth insulating layer 85 is formed on third insulating layer 84. Upper conductive wire 73 is thermo-compression bonded to connection pad 17 of printed wiring board 11 and electrode pad 18 of semiconductor chip 12, and part of upper conductive wire 73 is buried in fourth insulating layer 85.

Third insulating layer 84 prevents upper conductive wire 73 from being buried in second insulating layer 15 in a wire bonding step. Since fourth insulating layer 85 is softened by heat generated during thermo-compression bonding, conductive wire 73 is buried in fourth insulating layer 85 without being deformed. Thus, even if an external force is applied to conductive wires 13 and 73, wire sweep of conductive wires is suppressed.

Thus, a short circuit between conductive wires is prevented by laminating insulating layers 14, 15, 84 and 85 on semiconductor chip 12 and causing conductive wire 13 to pass between insulating layers. The number of insulating layers laminated is not limited and thermosetting insulating layers and thermoplastic insulating layers may be laminated in a sequential order. In this case, a conductive wire is buried in a thermoplastic insulating layer.

In the above described exemplary embodiments, electrode pad 18 of semiconductor chip 12 is disposed in the center of first surface 12a of the semiconductor chip, and first insulating layer 14 and second insulating layer 15 are disposed in the peripheral part of first surface 12a of the semiconductor chip. However, if part of the conductive wire that extends from the connection pad of the printed wiring board to the electrode pad of the semiconductor chip can be buried in the second insulating layer, the positions of the electrode pad, first insulating layer and second insulating layer can be arbitrarily changed.

While preferred embodiments of the present invention have been described using specific terms, such description is for illustrative purposes only, and it is to be understood that changes and variations may be made without departing from the spirit or scope of the following claims.

The invention claimed is:
1. A semiconductor device comprising:
a printed wiring board provided with a connection pad;

a semiconductor chip provided with an electrode pad; and
a conductive wire, one end of which is connected to the connection pad of the printed wiring board and the other end of which is connected to the electrode pad of the semiconductor chip,
wherein the semiconductor chip is mounted over the printed wiring board so that a first surface thereof provided with the electrode pad is oriented opposite to the printed wiring board,
a first insulating layer is formed on the first surface of the semiconductor chip oriented opposite to the printed wiring board,
a thermoplastic second insulating layer is formed on the first insulating layer, and
a part of the conductive wire between the one end and the other end is buried in the second insulating layer.

2. The semiconductor device according to claim 1, wherein the first insulating layer is made of thermosetting resin and
a setting temperature of the first insulating layer is lower than a softening temperature of the second insulating layer.

3. The semiconductor device according to claim 1, wherein the first insulating layer and the second insulating layer are formed on a peripheral part of the first surface of the semiconductor chip.

4. The semiconductor device according to claim 3, wherein the electrode pad of the semiconductor chip is disposed in a center of the first surface of the semiconductor chip.

5. The semiconductor device according to claim 4, wherein the conductive wire extends from the connection pad toward the second insulating layer, passes through the second insulating layer and extends toward the electrode pad of the semiconductor chip.

6. The semiconductor device according to claim 1, wherein a metal bump is formed on the electrode pad of the semiconductor chip, and
the second insulating layer is higher than the metal bump.

7. The semiconductor device according to claim 1, wherein the semiconductor chip is connected to the printed wiring board via an insulating joint.

8. The semiconductor device according to claim 1, wherein the semiconductor chip is connected to the printed wiring board via another semiconductor chip.

9. The semiconductor device according to claim 1, wherein a further semiconductor chip is mounted on the semiconductor chip via an insulating joint.

10. The semiconductor device according to claim 1, wherein at least the semiconductor chip and the conductive wire are covered with an insulating sealed body.

11. A semiconductor device comprising:
a wiring board having a connection pad on a first surface;
a semiconductor chip mounted over the first surface of the wiring board, the semiconductor chip having an electrode pad on an upper surface;
an insulating layer formed on a position of the upper surface of the semiconductor chip between the connection pad of the wiring board and the electrode pad of the semiconductor chip;
a thermoplastic resin layer formed on the insulating layer; and
a conductive wire electrically connected between the connection pad of the wiring board and the electrode pad of the semiconductor chip and embedded at a portion thereof in the thermoplastic resin layer.

12. The semiconductor device according to claim 11, wherein the insulating layer comprises a thermosetting resin layer, and
a setting temperature of the thermosetting resin layer is lower than a softening temperature of the thermoplastic resin layer.

13. The semiconductor device according to claim 11, wherein the insulating layer and the thermoplastic resin layer are formed on a peripheral portion of the upper surface of the semiconductor chip.

14. The semiconductor device according to claim 11, wherein the electrode pad of the semiconductor chip is disposed in a center portion of the upper surface of the semiconductor chip.

15. The semiconductor device according to claim 11, further comprising:
a bump electrode formed on the electrode pad of the semiconductor chip, the conductive wire being electrically connected to the electrode pad of the semiconductor chip via the bump electrode, and
the thermoplastic resin layer is higher than the bump electrode.

16. The semiconductor device according to claim 11, wherein the semiconductor chip is mounted over the first surface of the wiring board via another semiconductor chip.

17. The semiconductor device according to claim 11, further comprising:
a sealing member disposed on the first surface of the wiring board, the semiconductor chip and conductive wire are covered with the sealing member.

18. A semiconductor device comprising:
a wiring board including first and second areas;
a connection pad formed in the first area;
a semiconductor chip mounted on the second area and including an electrode pad;
a conductive wire provided to connect the electrode pad to the connection pad;
a thermoplastic resin covering a part of the conductive wire; and
an insulating layer provided to cooperate with the thermoplastic resin to sandwich the conductive wire therebetween, wherein the thermoplastic resin is formed on the insulating layer.

* * * * *